United States Patent
Goda et al.

(10) Patent No.: US 8,767,487 B2
(45) Date of Patent: Jul. 1, 2014

(54) DRAIN SELECT GATE VOLTAGE MANAGEMENT

(75) Inventors: Akira Goda, Boise, ID (US); Pranav Kalavade, San Jose, CA (US); Doyle Rivers, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 463 days.

(21) Appl. No.: 12/715,530

(22) Filed: Mar. 2, 2010

(65) Prior Publication Data

US 2011/0216600 A1 Sep. 8, 2011

(51) Int. Cl.
*G11C 7/00* (2006.01)
(52) U.S. Cl.
USPC .................................................. 365/189.16
(58) Field of Classification Search
USPC ................................................ 365/189.011
See application file for complete search history.

(56) References Cited

U.S. PATENT DOCUMENTS

| | | | |
|---|---|---|---|
| 6,188,611 B1* | 2/2001 | Endoh et al. | 365/185.24 |
| 7,324,383 B2 | 1/2008 | Incarnati et al. | |
| 7,692,971 B2 | 4/2010 | Moschiano et al. | |
| 2004/0057286 A1* | 3/2004 | Chen et al. | 365/185.17 |
| 2006/0291285 A1* | 12/2006 | Mokhlesi et al. | 365/185.18 |
| 2007/0297234 A1* | 12/2007 | Cernea et al. | 365/185.18 |
| 2008/0205147 A1* | 8/2008 | Santin et al. | 365/185.17 |
| 2011/0080789 A1 | 4/2011 | Kalavade et al. | |
| 2011/0110153 A1* | 5/2011 | Dutta et al. | 365/185.03 |
| 2011/0280082 A1 | 11/2011 | Ruby et al. | |

* cited by examiner

*Primary Examiner* — Huan Hoang
*Assistant Examiner* — Min Huang
(74) *Attorney, Agent, or Firm* — Schwegman, Lundberg & Woessner, P.A.

(57) ABSTRACT

Some embodiments include apparatus, systems, and methods that operate to apply a first value of a drain select gate voltage during a first portion of a programming time period associated with programming a plurality of memory cells, and to apply a second value of the drain select gate voltage different from the first value during a second, subsequent portion of the programming time period. The drain select gate voltage may be changed between groups of programming pulses in a single programming cycle. The first and second portions may be determined according to the number of applied programming pulses, the number of memory cells that have been completely programmed, and/or other conditions. Additional apparatus, systems, and methods are disclosed.

18 Claims, 7 Drawing Sheets

DRAIN SELECT GATE VOLTAGE MANAGEMENT

BACKGROUND

Memory devices are widely used in computers and other electronic devices to store data and other information. Some memory devices, such as flash memory devices, do not need power to maintain the information stored in the device.

A flash memory device usually makes use of a programming operation to store information, a read operation to retrieve the stored information, and an erase operation to clear some or all of the information in the device. Programming, read, and erase operations in a flash memory device usually involve applying different voltages to various components of the device.

Programming operations generally proceed according to a well-defined sequence of voltage application operations. However, sometimes programming operations fail, such as when the select gate voltage is applied in a manner that unintentionally turns off cells that have been selected for programming (e.g., due to an insufficient select gate voltage level when higher data line voltages are used in multi-level cells). Programming operations can also fail when non-selected cells are programmed unintentionally (e.g., due to select gate voltage leakage between selected cells and non-selected cells).

DETAILED DESCRIPTION

Figure 1:
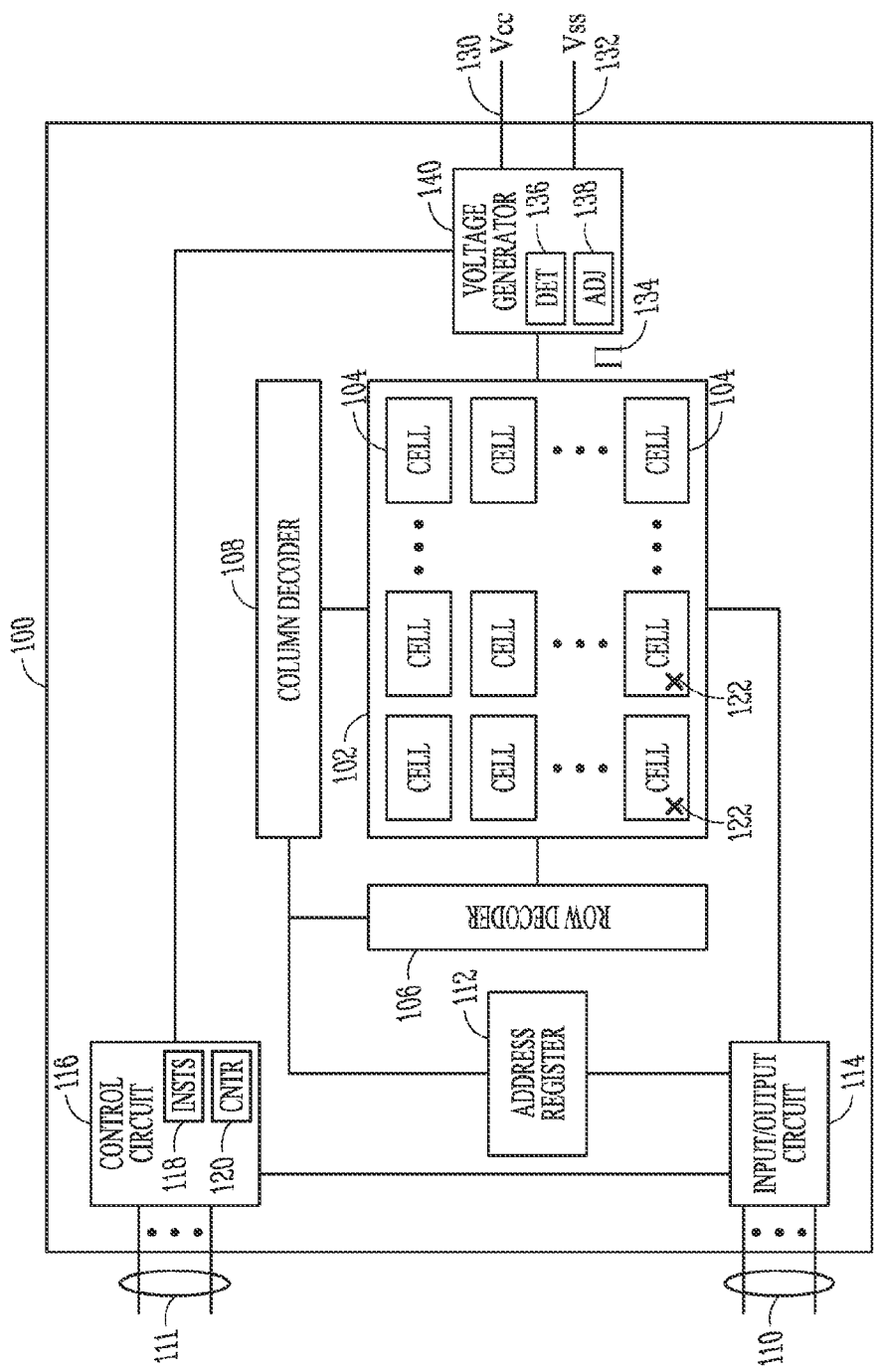
FIG. 1 is a block diagram of a memory device comprising an array of memory cells, according to an embodiment of the invention.

To address the challenges presented by the potential programming operation failures noted above, in some embodiments, the drain select gate voltage across multiple data lines (e.g., bit lines) can be dynamically adjusted, in synchronization with various programming operation activities. For example, the drain select gate voltage may be changed during a single programming cycle based on the number of programming pulses that have been applied. The drain select gate voltage can also be adjusted during a single programming cycle based on the number of memory cells that remain incompletely-programmed, as well as other conditions. Many embodiments may be implemented as part of flash memory device operation.

Flash memory devices are utilized as non-volatile memory for a wide range of electronic applications. Flash memory devices typically use a one-transistor memory cell that allows for high memory densities, high reliability, and low power consumption.

Two common types of flash memory array architectures are the "NAND" and "NOR" architectures, so-called for the logical form in which the basic memory cell configuration of each is arranged.

A NAND array architecture has an array of charge-storage memory cells arranged in a matrix such that the control gates of each memory cell of the array are coupled by rows to access lines (e.g., word lines). However each memory cell is not directly coupled to a data line (e.g., bit line) by its drain. Instead, the memory cells of the array are coupled together in series, source to drain, between a source line and a data line.

Memory cells in a NAND array architecture can be programmed to a desired state. That is, electric charge can be placed on or removed from the charge-storage node of an individual memory cell, to put the cell into a number of stored states. For example, a single level cell (SLC) can be programmed to represent one of two binary states, e.g., 1 or 0. Some flash memory cells can also be used to store more than two binary states, e.g., 1111, 0111, 0011, 1011, 1001, 0001, 0101, 1101, 1100, 0100, 0000, 1000, 1010, 0010, 0110, and 1110. Such cells may be referred to as multi-level cells (MLCs). The use of MLCs permit the manufacture of higher density memories without increasing the number of memory cells, since each cell can represent more than one bit of information. MLCs can thus have more than one programmed state, e.g., a cell capable of representing the states of four bits can have fifteen programmed states, plus an erased state.

The state of a memory cell, e.g., the data stored in the cell, is determined by the threshold voltage (Vt). As an example, in an SLC, a Vt of 0.5V can indicate a programmed cell while a Vt of –0.5V might indicate an erased cell. An MLC includes multiple Vt ranges that can each be used to indicate a different state.

In MLCs, it is useful to separate the ranges of Vt by an amount sufficient to reduce the possibility of a higher voltage Vt of one range overlapping a lower Vt of the next range. The overlap can occur due to factors such as noise, floating gate coupling, or temperature variations of the integrated circuit, among various other factors. One way to create larger gaps between the various Vt ranges is to narrow the ranges themselves. This can be difficult because memory cells program at different rates, e.g., the Vt for cells within a group might increase at varying rates, due to factors such as manufacturing process variations and/or repeated programming and erasing, among other factors.

In addition to the difficulties that can be encountered due to overlap in Vt ranges, manufacturing variations and other factors can also contribute to programming errors based on the level of the drain select gate voltage (e.g., insufficient level of drain select gate voltage when higher level data line voltage are used, or a drain select gate voltage that is too high, causing leakage between selected and non-selected cells).

By implementing one or more of the various embodiments described herein, the drain select gate voltage level can be dynamically adjusted to help reduce the number of failures during a programming cycle that are caused by a level that is too low at some times, and too high at others. For example, since data line voltages are often reduced to program the higher levels of MLC memories, the maximum drain select gate voltage level can also be reduced when these levels are programmed. The adjustment of the maximum drain select gate voltage under these conditions, promoting the occurrence of an increased number of successful programming cycles, will now be described in more detail.

FIG. 1 is a block diagram of a memory device 100 comprising an array 102 of memory cells 104, according to an embodiment of the invention. The memory device 100 includes a memory array 102 with memory cells 104 arranged in rows and columns. The row decoder 106 and column decoder 108 respond to an address register 112 to access memory cells 104 based on row address and column address signals presented on lines 110.

A data input/output circuit 114 transfers data between memory cells 104 and lines 110. A control circuit 116 controls the operations of memory device 100 based on the state of signals on lines 110 and 111.

The memory device 100 can be a non-volatile memory device. For example, the memory device 100 can be a NAND flash memory device where the memory cells 104 include flash memory cells arranged according to a NAND flash memory architecture. One of ordinary skill in the art will realize that the memory device 100 often includes other parts, which are omitted from FIG. 1 to more clearly focus on the various embodiments described herein.

The memory device 100 includes lines 130 and 132 to receive voltages Vcc and Vss. Vcc can be the supply voltage for memory device 100; Vss can be ground. The memory device 100 also includes a voltage generator 140. The voltage generator 140 and control circuit 116 may act separately or together as a module or as a part of a module to provide different voltages to the memory array 102 (e.g., to cause memory array 102 to receive different operational voltage sequences) during various operations of the memory device 100. The operations include a programming operation to transfer (e.g., write) data from lines 110 to memory cells 104, a read operation to transfer (e.g., read) data from memory cells 104 to lines 110, and an erase operation to erase (e.g., clear) data from all or a portion of memory cells 104.

The control circuit 116 may include instructions 118 to direct memory device operations, including programming operations. The control circuit 116 may also include a determination module 120 to determine the number of programming pulses that have been applied to one or more cells 104 in the array 102, and/or to determine the number of incompletely-programmed cells within a subset of the array 102 of memory cells 104. One or more determination modules 120 may be disposed in a number of locations within the device 100.

For example, the voltage generator 140 may include a more specific form of the determination module 120, in the form of a counter 136 to count the number of programming pulses applied to a subset of the array 102 of memory cells 104. The counter 136 may also be used to count the number of incompletely-programmed cells within a subset of the array 102 of memory cells 104. The determination module 120 and counter 136 may each be located as shown in FIG. 1, or in other locations within the device 100.

The voltage generator 140 may include an adjustment module 138, which can be used to adjust the value of the (maximum) drain select gate voltage applied to the cells 104. In some embodiments, the determination module 120 and/or the counter 136 can provide an indication 134 to the adjustment module 138 when the number of programming pulses reaches a selected number, or when a selected number of cells 104 in the array 102 have completed programming (or when a selected number of cells are not yet completely programmed).

The memory device 100 includes embodiments of the devices and circuitry described below with respect to FIGS. 2-4. The memory device 100 can operate according to any of the methods described below with respect to FIGS. 3-7.

Figure 2:
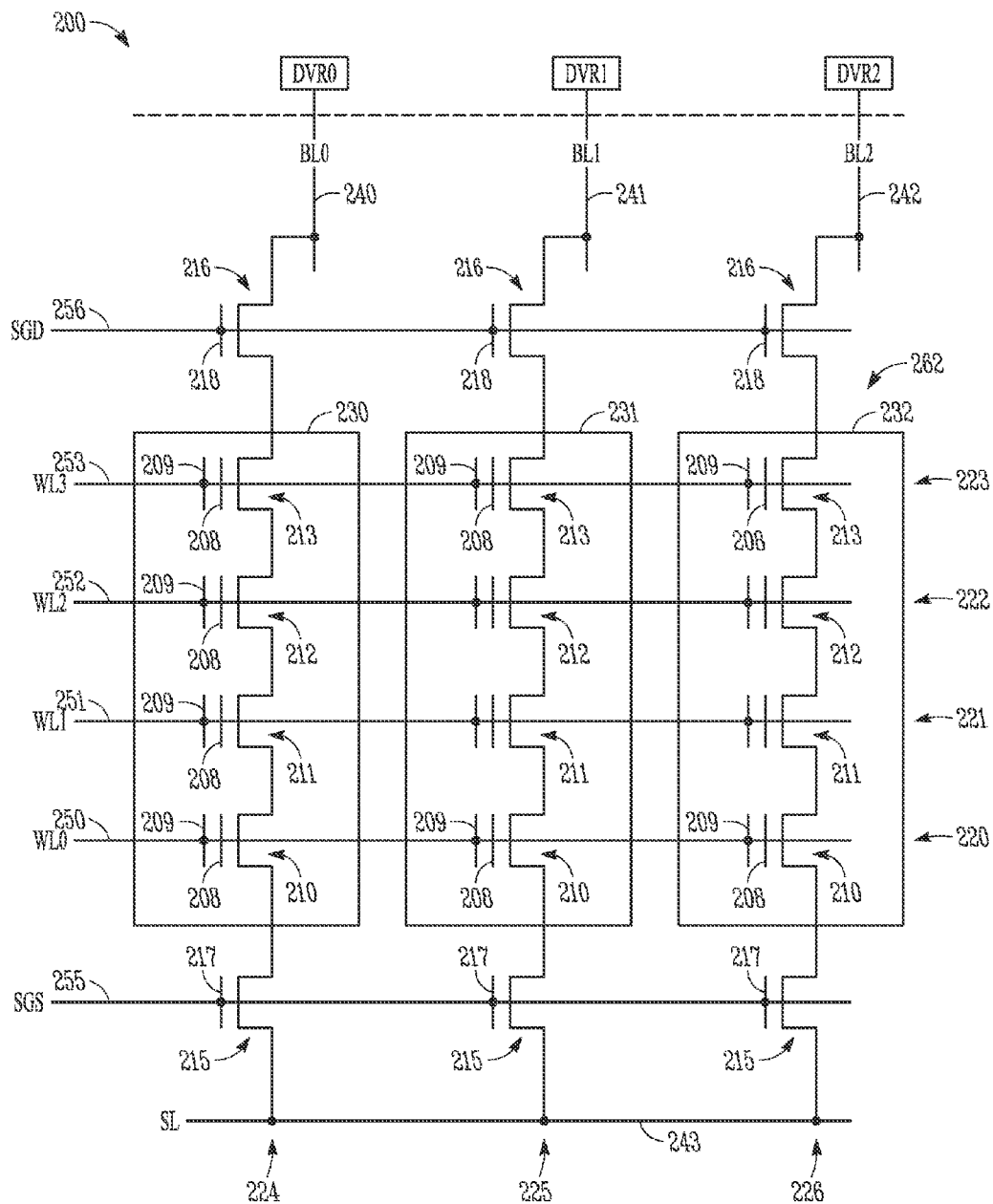
FIG. 2 is a partial schematic diagram of the memory device of FIG. 1, according to various embodiments of the invention.

FIG. 2 is a partial schematic diagram of the memory device 100 of FIG. 1, according to various embodiments of the invention. The circuit 200 includes memory cells 210, 211, 212, and 213 arranged in rows 220, 221, 222, and 223, and columns 224, 225, and 226. The memory cells in the same column are connected in a string of memory cells, such as strings 230, 231, and 232. FIG. 2 shows an example of three strings and each string has four memory cells. However, the number of strings and memory cells in each string may vary.

It should be noted that in many embodiments, a column (e.g., column 224) includes more than one string of memory cells. In addition, it should be noted that rows 220, 221, 222, 223 and columns 224, 225, and 226 do not require a specific physical orientation of the individual cells 210, 211, 212, 213. Thus the arrangement of rows 220, 221, 222, 223; columns 224, 225, and 226; and cells 210, 211, 212, 213 shown in the figure is only one arrangement of many that may be implemented.

Circuit 200 also includes select transistors 215 and 216. Each select transistor 215 is coupled between one of the strings 230, 231, and 232 and a source line 243 associated with a source line signal SL. Each select transistor 215 includes a gate 217 coupled to a select line 255. A source select gate signal SGS on select line 255 is used to activate (turn on) select transistors 215 to electrically couple strings 230, 231, and 232 to source line 243.

Each transistor 216 is coupled between one of strings 230, 231, and 232 and one of the data lines (e.g., bit lines) 240, 241, and 242 associated with data line (e.g., bit line) signals BL0, BL1, and BL2, respectively. Each select transistor 216 includes a gate 218 coupled to a select line 256.

A drain select gate voltage signal SGD on select line 256 is used to activate select transistors 216 to electrically couple strings 230, 231, and 232 to data lines 240, 241, and 242. FIG. 2 shows select transistors 215 and 216 being outside strings 230, 231, and 232. However, transistors 215 and 216 can also be viewed as part of these strings, such that each of the strings 230, 231, 232 can also include a corresponding select transistor 215 and a corresponding select transistor 216. For example, string 231 also includes a select transistor 215 and a select transistor 216 that are coupled between data line 241 and source line 255, respectively.

As shown in FIG. 2, each of memory cells 210, 211, 212, and 213 includes a charge storage node (e.g., a floating gate) 208, and a control gate 209. Memory cells (e.g., memory cells 210) having their control gates commonly coupled (e.g., to the same access line (e.g., word line)), such as access line 250, 251, 252, or 253, are referred to herein as "rows". Access line signals WL0, WL1, WL2, and WL3 on access lines 250, 251, 252, and 253 are used to access memory cells 210, 211, 212, and 213.

To program, read, or erase the memory cells 210, 211, 212, and 213, the memory circuit 200 operates to apply various voltages to select lines 255 and 256, access lines 250, 251, 252, and 253, data lines 240, 241, and 242, and source line 243. Data line drivers DVR0, DVR1, DVR2 can be used to drive the data lines 240, 241, 242, respectively, with a variety of voltages provided by the voltage generator 140 of FIG. 1. These voltages include programming voltages, and inhibit voltages (e.g., about 2.0 V, sometimes designated Vccr).

For example, to program the memory cell 212 at the crosspoint of access line WL2 and data line BL1, Vpgm can be applied to the access line WL2, and a "program selected" voltage sel_Vbl (~1V) can be applied to the data line BL1. A "program inhibited" voltage Vcc (~2.3V) can be applied to data lines BL0 and BL2. Changes to the data line voltages described herein (in conjunction with reducing the drain select gate voltage value Vsgd) occur at the program selected data lines, and not at the program inhibited data lines. To focus more directly on the embodiments described herein, this description omits details of the read and erase operations that can be implemented by the memory circuit 200.

Figure 3:
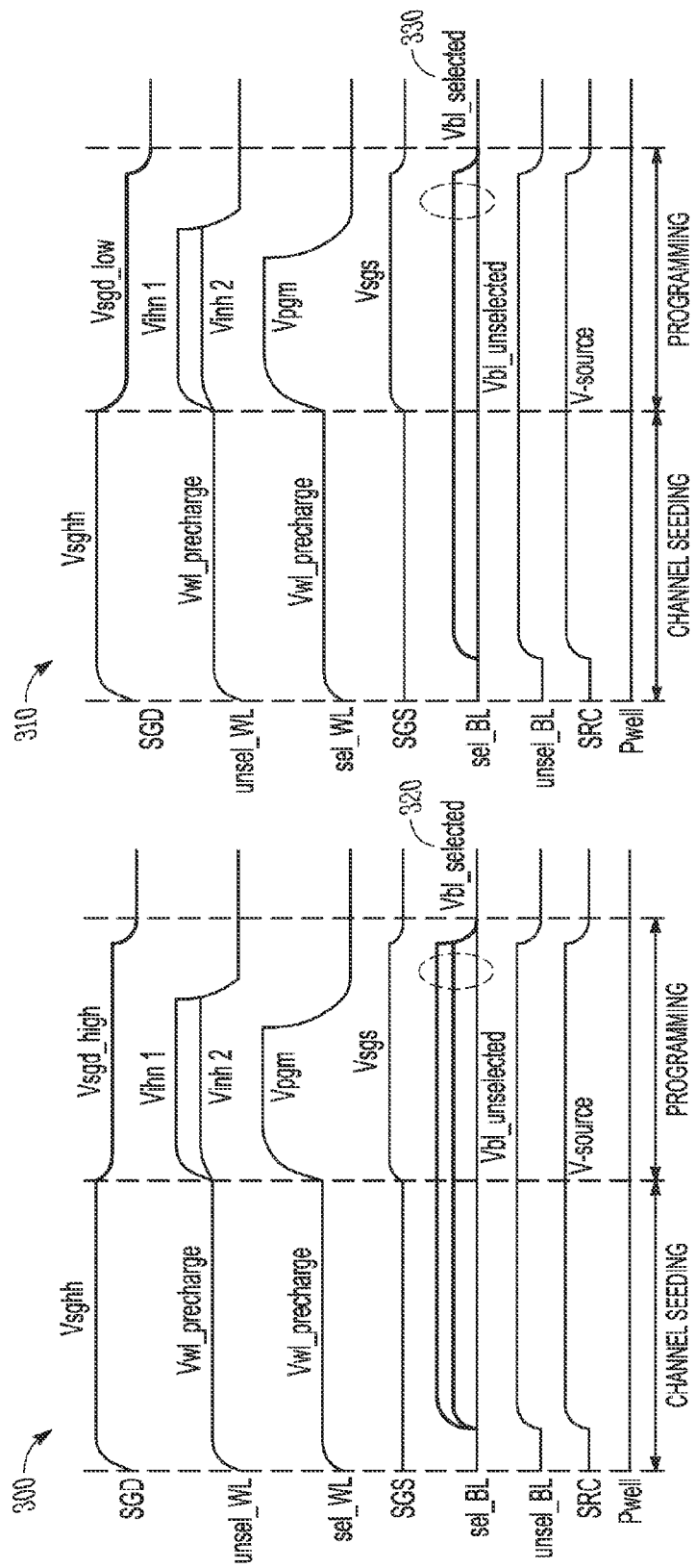
FIG. 3 includes graphs of voltages applied to an array of memory cells, such as the arrays of FIG. 1 and FIG. 2, according to various embodiments of the invention.

FIG. 3 includes graphs 300, 310 of voltages applied to an array of memory cells, such as the arrays 102, 262 of FIG. 1 and FIG. 2, respectively, according to various embodiments of the invention. Here the drain gate select voltage (SGD), access line unselect voltage (unsel_WL), access line select voltage (sel_WL), source gate select voltage (SGS), data line select voltage (sel_BL), data line unselect voltage (unsel_BL), source voltage (SRC), and p-well voltage (Pwell) are shown as time progresses during channel seeding operations (e.g., to establish channel identifier data) and programming operations. Since the operation of unsel_WL, SGS, unsel_BL, SRC, and Pwell voltages are well known to those of ordinary skill in the art, and operate in a conventional fashion with respect to the various embodiments, these elements will not be discussed further.

The first graph 300 represents the activity comprising a single programming pulse, where the SGD voltage level is held at a relatively high level. The second graph 310 also represents activity comprising a single programming pulse. However, in this case, the SGD voltage level is reduced to a relatively low level (i.e., some level that is less than the higher SGD voltage level shown in the first graph 300).

Upon inspection, a review of the first and second graphs 300, 310 makes it clear that the SGD voltage level can be adjusted while various levels of sel_BL are used, as part of a programming cycle. That is, the SGD voltage level can be adjusted (e.g., reduced) between groups of programming pulses, rather than within a programming pulse.

For the purposes of this document, a single "programming pulse" comprises a seeding portion followed by an associated programming portion; one programming pulse is shown in graph 300, and one programming pulse is shown in graph 310. Thus, several programming pulses are usually applied during a complete programming cycle—some near the beginning of the cycle that utilize a higher SGD voltage (e.g., graph 300), and some near the end of the cycle that utilize a lower SGD voltage (e.g., graph 310). Multiple values of the sel_BL voltage can be applied during the application of the higher level of SGD voltage, and during the application of the lower level of the SGD voltage. In most embodiments, the maximum level of any sel_BL voltage 320 that is applied before the level of the SGD voltage is reduced (e.g., graph 300) is higher than the maximum level of the sel_BL voltages 330 that are applied after the SGD voltage level has been reduced (e.g., graph 310). In other words, the maximum level of the sel_BL voltage 330 applied after the SGD voltage level is reduced is less than the maximum level of the sel_BL voltage 320 that is applied before the SGD voltage level is reduced.

When the SGD voltage is adjusted in this manner (e.g., the SGD voltage is reduced between groups of the programming pulses that make up a single programming cycle), the occurrence of the problems noted above may be reduced, or even avoided. Namely, the SGD voltage can be applied in a manner that helps avoid unintentionally turning off cells that have been selected for programming (e.g., by permitting a sufficient SGD voltage level when higher data line voltages are used to program multi-level cells). The SGD voltage can also be applied in a manner that helps avoid programming non-selected cells, by reducing the level of the SGD voltage, which in turn reduces SGD leakage in the unselected strings. The timing of the SGD voltage adjustment within a programming cycle will now be explained.

Figure 4:
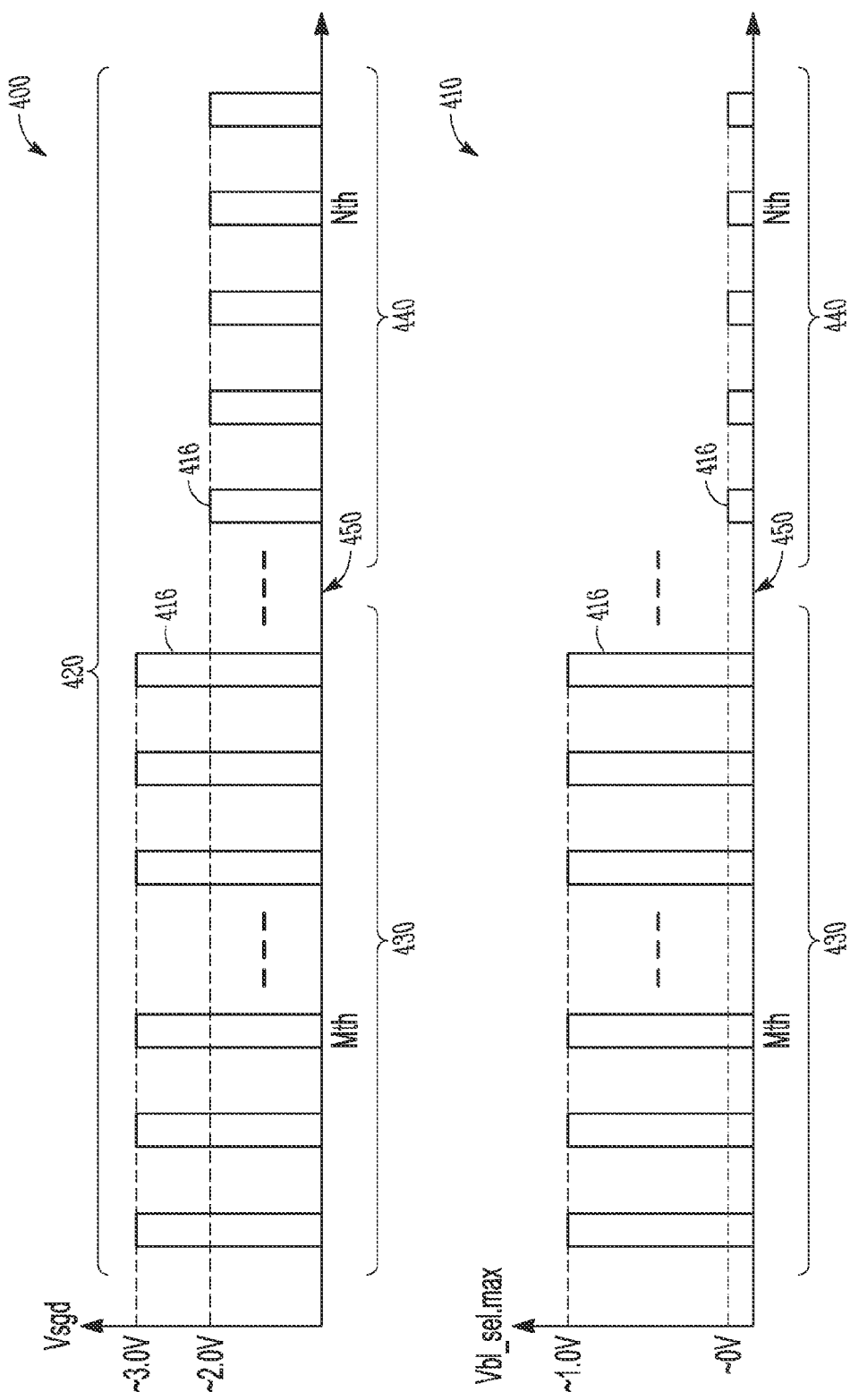
FIG. 4 includes graphs illustrating the application of drain select gate voltage Vsgd and data line voltage Vbl_sel.max versus programming cycle time, according to various embodiments of the invention.

FIG. 4 includes graphs illustrating the application of drain select gate voltage Vsgd and data line voltage Vbl_sel.max versus programming cycle time, according to various embodiments of the invention. Here it can be seen that a number of programming pulses 416 are applied: a first group of M pulses during a first portion of time 430, and a second group N pulses during a second portion of time 440. The two portions of time 430, 440, taken together, make up a single programming cycle 420 time period. Each of the programming pulses 416 corresponds to the activity shown in one of the graphs 300, 310 of FIG. 3.

Returning now to FIG. 4, it can be seen that in the upper graph 400, during the first portion of time 430, the value of the drain select gate voltage Vsgd (the same as the voltage Vsgd_high of FIG. 3) is applied at a higher value, such as about 3 volts. Thereafter, during the second portion of time 440, between the groups of M pulses and N pulses, the voltage Vsgd is applied at an adjusted value, such as a reduced value (e.g., the same as the voltage Vsgd_low of FIG. 3). In this case, about 2 volts.

The lower graph 410 shows how, for example, the maximum value of the data line voltage Vbl_sel.max is reduced over time, perhaps using reduced values as the programming cycle proceeds toward completion. Here, a reduction from a maximum value of about 1.0 V to about 0.0 V is shown, corresponding to the values of Vbl_selected 320, 330 in FIG. 3, for example. Other values of Vbl_sel.max may be used, such as about 0.6 volts, or 0.4 volts. This reduction of maximum applied Vbl_sel.max values can be synchronized to the reduction of the drain select gate voltage Vsgd, as shown in FIG. 4, so as to occur between pulses 416.

To determine the point in time 450 at which the transition from one value of Vgsd to another takes place, several mechanisms may be used. For example, in some embodiments, the transition from one level of Vsgd to another may occur after a selected number of programming pulses (e.g., M pulses) have been applied, either overall, or with respect to a selected level of an MLC memory array. In some embodiments, the transition from one level of Vsgd to another may occur after a selected number of array cells have been completely programmed, or programmed to a selected level. The selected level can be any available level provided by the cells, including one level below the maximum (voltage) level. This number of programmed cells can be determined by counting the number of cells that have been programmed, or by counting the number of cells that have not yet been completely programmed (e.g., the number of incompletely-programmed cells). Thus, various embodiments may be realized.

For example, referring now to FIGS. 1-4, it can be seen that an apparatus 100 may comprise an array 102, 262 of memory cells 104 and a drain select gate voltage adjustment module 138. The adjustment module 138 can operate to adjust a drain select gate voltage value Vsgd associated with the array 102, 262 of memory cells 104 from a first value to a second value during a single programming cycle of a subset of the array 102, 262 of memory cells 104. This adjustment is usually made between groups of programming pulses, and not within a single programming pulse.

The apparatus 100 may include a counter 136 to count the number of programming pulses applied to a subset of the array 102, 262 of memory cells 104. The counter 136 can also operate to provide an indication 134 to the adjustment module 138 when the number of programming pulses reaches a selected number.

The apparatus 100 may also include a counter 136 to count the number of memory cells that have, or have not yet been programmed (e.g., to some specified level). Thus, the apparatus 100 may comprise a counter 136 to count a number of incompletely-programmed cells 122 within a subset of the array 102, 262 of memory cells 104. In this case, the counter 136 can operate to provide an indication 134 to the adjustment module 138 when the number of incompletely-programmed cells 122 reaches a selected number (e.g., when eight cells out of 1024 cells have not yet been programmed to Level 3 (the maximum level in this particular example) out of the available MLC programming levels Level 0, Level 1, Level 2, and Level 3).

In some embodiments, an apparatus 100 comprises an array 102, 262 of memory cells 104, as well as a determination module 120 to determine a number of programming pulses applied to a subset of the array 102, 262 of memory cells 104. The apparatus 100 further includes an adjustment module 138 to adjust the drain select gate voltage value Vsgd associated with the array 102, 262 of memory cells 104 responsive to the number of programming pulses.

The adjustment module 138 may operate to reduce the drain select gate voltage value Vsgd to an adjusted select gate voltage value when the number of programming pulses reaches a selected number.

A data line (e.g., bit line) driver can be used to reduce the level of the program selected data line voltage sel_BL applied to a program selected group of memory cells in the array 102, 262 at substantially the same time the drain select gate voltage Vsgd is reduced, such as when the number of programming pulses reaches some selected number. Thus, the apparatus 100 may comprise one or more data line voltage drivers DRV0, DRV1, DRV2 to provide a reduced maximum (e.g., non-positive) data line voltage sel_BL to a program selected group of a subset of the array 102, 262 of memory cells 104 when the number of programming pulses reaches a selected number.

In some embodiments, and apparatus 100 comprises an array 102, 262 of memory cells 104, and a determination module 120 to determine a number of cells 122 within the array 102, 262 of memory cells 104 that have not been programmed to a selected level. The apparatus 100 may also comprise an adjustment module 138 to adjust a drain select gate voltage value Vsgd associated with the array 102, 262 of memory cells 104 responsive the number of cells that have not been programmed.

In some embodiments, the drain select gate voltage Vsgd may be reduced once the number of successfully programmed cells have been programmed to a level that is just below the maximum available level. Thus, the determination module 120 may operate to determine a number of cells 122 within the array 102, 262 of memory cells 104 that have not been programmed to a selected level that is one level less than a maximum level.

A data line (e.g., bit line) driver DRV0, DRV1, DRV2 can be used to reduce the maximum level of the data line voltage sel_BL applied to memory cells 104 in the array 102, 262 when the drain select gate voltage Vsgd is reduced. Thus, the apparatus 100 may comprise one or more data line voltage drivers DRV0, DRV1, DRV2 to provide a higher (e.g., positive) program selected data line voltage to a program selected group of the cells 104 within the array 102, 262 of memory cells until the drain select gate voltage value Vsgd is adjusted, perhaps to a reduced value. Thereafter, the voltage drivers DRV0, DRV1, DRV2 may operate to provide a lower (e.g., reduced maximum value, including a fixed, non-positive value, such as zero volts) program selected data line voltage to the program selected group of the cells 104 within the array 102, 262 of memory cells.

The illustrations of apparatus 100 such as memory devices, and the circuitry 200 that can be used within the apparatus 100 are intended to provide a general understanding of the structure of various embodiments and not a complete description of all the elements and features of the apparatus that might make use of the structures described herein.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments include a number of methods.

Figure 5:
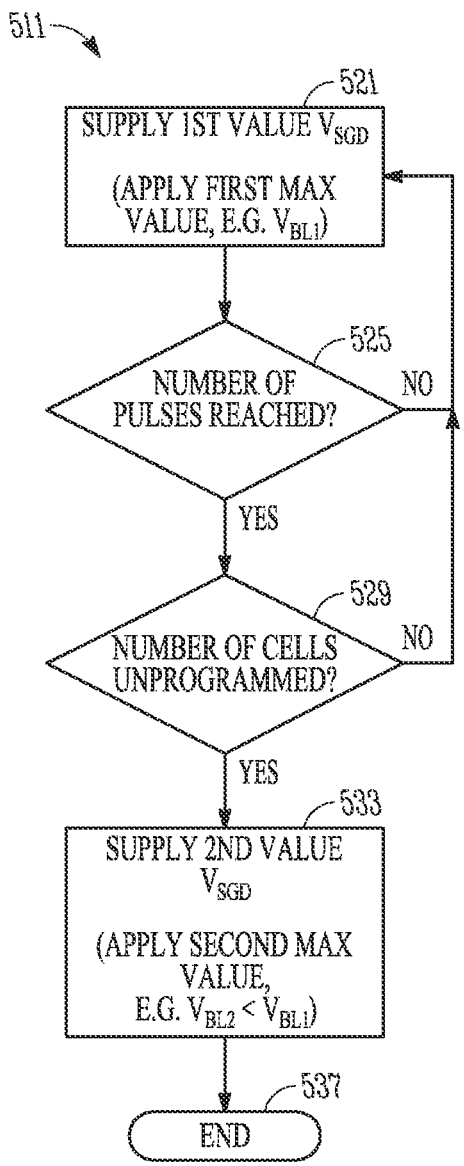
FIG. 5 is a flow diagram of a method to manage drain select gate voltage, according to various embodiments of the invention.

FIG. 5 is a flow diagram of a method 511 to manage drain select gate voltage, according to various embodiments of the invention. Thus, a method 511 may begin at block 521 with applying a first value of the drain select gate voltage during a first portion of a programming time period associated with programming a plurality of memory cells.

During the first portion of the programming cycle, applied data line (e.g., bit line) voltages may be set to a first program selected maximum value, such as a positive value. Thus, the activity at block 521 may comprise applying first program selected maximum value, such as a positive data line voltage during the first portion of the programming time period.

The adjusted voltage value may be applied as a drain select gate voltage based on the number of programming pulses that have been applied. Thus, the method 511 may continue on to block 525, to determine whether a selected number of programming pulses has been reached. This activity may comprise refraining from applying a second value of the drain select gate voltage (by returning to block 521) until the number of programming pulses applied to the plurality of memory cells reaches a selected number (e.g., less than a maximum desired number).

In some embodiments, the method 511 may take into account whether a number of cells have not yet been completely programmed. Thus, the method 511 may continue on to block 529 with refraining from applying a second value of the drain select gate voltage (by returning to block 521) until a selected number of the plurality of memory cells has been programmed to a selected level of multiple available levels.

The selected level of programming may be any level that is available within the memory array architecture. Thus, the selected level may comprise one of a first level (e.g., L1) or a second level (e.g., L2), the first level and the second level both being less than a maximum (available) level (e.g., L3) of some number of multiple levels.

The selected level of programming may be a level that is just under the maximum available level. Thus, the selected level may comprise one level below a maximum (available) level of the multiple levels. For example, the selected level may be a second programmed level, L2, where there are a maximum of three programmed levels (and one erased level, L0).

The method 511 may continue on to block 533 to include applying a second value of the drain select gate voltage different from the first value during a second, subsequent portion of the programming time period associated with programming the plurality of memory cells. This may include applying the adjusted voltage value as a drain select gate voltage based on the number of memory cells that have been successfully programmed to some selected level. The second value of the drain select gate voltage can be less than the first value of the drain select gate voltage.

During the second portion of the programming cycle, applied program selected data line (e.g., bit line) voltages may comprise a second maximum program selected value (e.g., $V_{BL2}$) that is less than the first maximum program selected value (e.g., $V_{BL1}$). The second maximum program selected value may be variable, or fixed during the second portion of the programming cycle. The second maximum program selected value may be a non-positive (e.g., zero or negative) value. Thus, the activity at block 533 may comprise applying a second maximum program selected value less than the first maximum program selected value, such as a non-positive program selected data line voltage to a program selected group of the plurality of memory cells during the second portion of the programming time period. In some embodiments then, the maximum program selected data line voltage that is applied during the second portion of the programming cycle is less than the maximum program selected data line voltage that is applied during the first portion of the programming cycle. This reduction of the program selected data line voltage can be synchronized to the reduction in the drain gate select voltage, to occur between groups of programming pulses in a single programming cycle.

In some embodiments, a positive program selected data line (e.g., bit line) voltage can be used for all levels of programming, except for the highest level. Thus, the activity at block 533 may comprise applying a non-positive program selected data line voltage to the program selected group of a subset of the plurality of memory cells during the second, subsequent portion of the programming time period only when a highest level of programming voltage is applied to the subset. The method 511 may then terminate at block 537. Additional embodiments may be realized.

Figure 6:
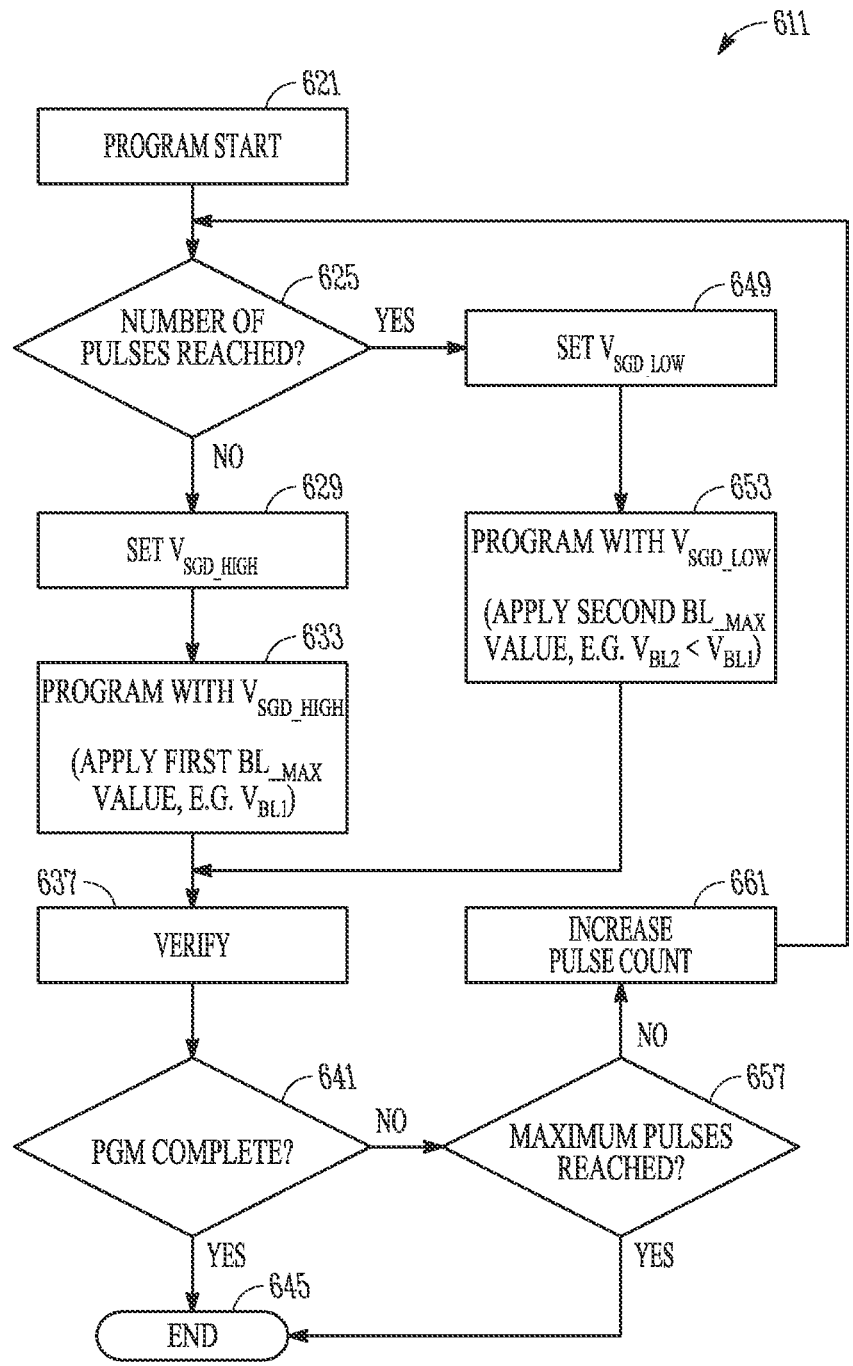
FIG. 6 is a flow diagram of a method to manage drain select gate voltage that operates by counting a number of programming pulses, according to various embodiments of the invention.

For example, FIG. 6 is a flow diagram of a method 611 to manage drain select gate voltage that operates by counting a number of programming pulses, according to various embodiments of the invention. In this case, a method 611 may begin at block 621. The method 611 may continue on to block 625, with determining whether a selected number of programming pulses has been applied to the memory array, or some subset of the array. If not, the method 611 may go on to block 629. If so, the method 611 may continue on to block 649.

The number of programming pulses applied to the memory cells may be greater in the first portion of the programming cycle than in the second portion of the programming cycle. Thus, the number of programming pulses applied to the plurality of memory cells during a time the drain select gate voltage value is applied can be greater than a number of programming pulses applied to the plurality of memory cells during a time when an adjusted select gate voltage value is applied.

At block 629, the activity may comprise adjusting the drain select gate voltage value to a first, higher value. The method 611 may then continue on to block 633 with applying a first maximum value of the program selected data line voltage (e.g., $V_{BL1}$) to some of the plurality of memory cells in conjunction with applying the first, higher value of the drain select gate voltage.

The method 611 may then continue on to block 637, to verify the programming of the selected cells. This happens during each programming cycle. If the cells are verified as programmed, and programming of the cells is determined to be complete at block 641, then the method 611 may end at block 645. However, if programming of the cells is not complete, as determined at block 641, the method 611 may continue on to block 657, to determine whether the desired maximum number of programming pulses is reached. If so, the method 611 may terminate at block 641. Otherwise, the additional programming pulse is counted at block 661, so that the pulse count is increased by one, and then the method 611 may continue on to block 625. Once the desired number of programming pulses associated with the first, higher drain select gate voltage is reached, as determined at block 625, the method 611 may continue on to block 649.

At block 649, the activity may thus comprise adjusting the drain select gate voltage value to an adjusted select gate voltage value after the number of programming pulses has reached a selected number (e.g., less than a desired maximum number). Adjusting the applied drain select gate voltage value may involve setting a second, lower value of the voltage between the application of groups of programming pulses. Thus, the activity of adjusting at block 649 may comprise reducing the drain select gate voltage value to the adjusted select gate voltage value between groups of programming pulses (e.g., see FIG. 4, between a group of M pulses, and group of N pulses).

The method 611 may include the activity of block 653, by continuing to apply programming pulses to the plurality of memory cells in conjunction with applying an adjusted select gate voltage value, with verification, until programming is complete, or until the number of programming pulses reaches the maximum number. Thus, the method 611 may continue from block 653 on to blocks 637, 641, 645, 657 and 661, as described previously.

The activity at block 653 may further include applying a second maximum value of the program selected data line voltage (e.g., $V_{BL2}$) to some of the plurality of memory cells in conjunction with applying the adjusted (e.g., second, lower) select gate voltage value, the second maximum program selected data line voltage being less than the first maximum program selected data line voltage (e.g., $V_{BL2}<V_{BL1}$). For example, if the first maximum program selected data line voltage is positive, the second maximum program selected data line voltage may be any lesser value, including about zero, or negative. Further embodiments may be realized.

Figure 7:
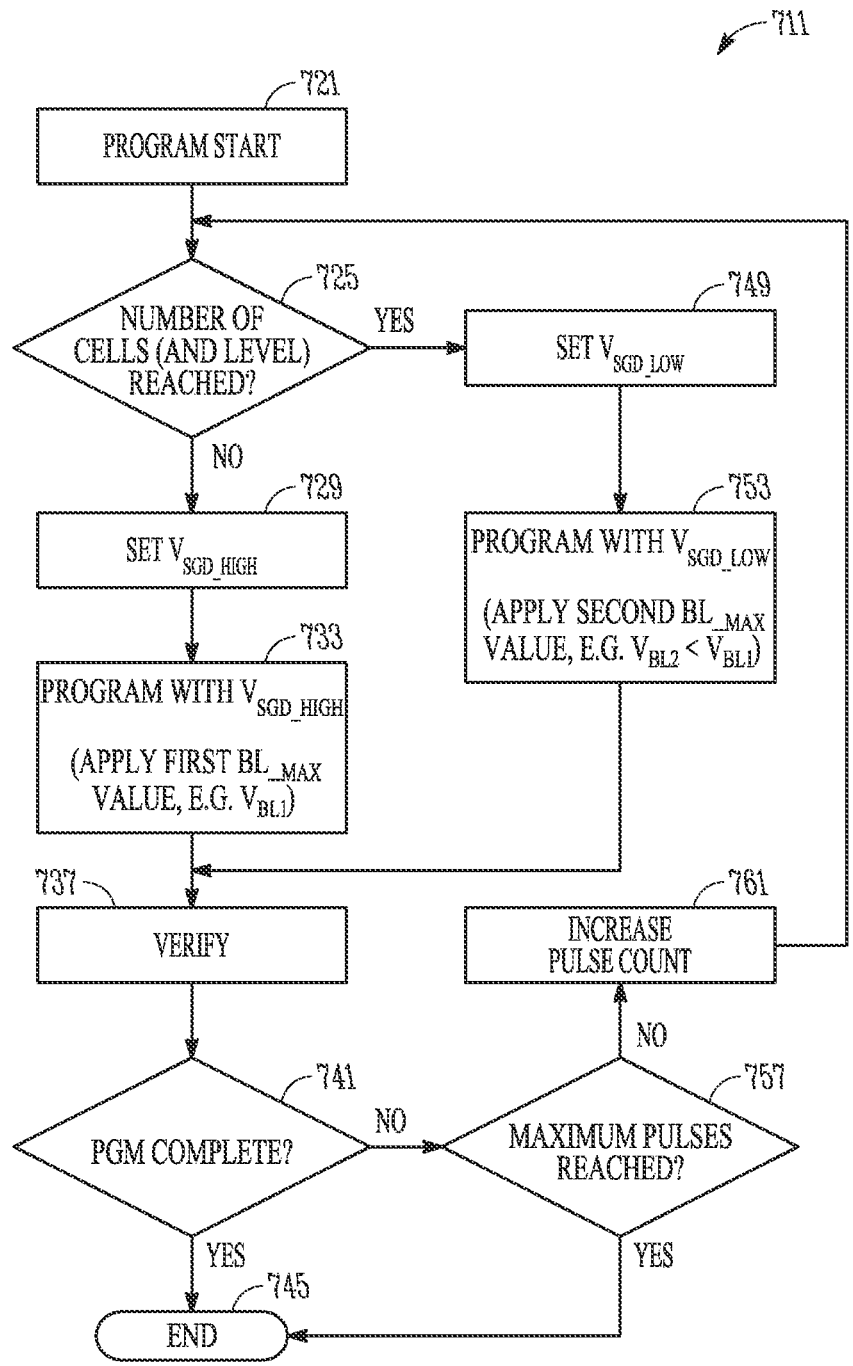
FIG. 7 is a flow diagram of a method to manage drain select gate voltage that operates by counting a number of incompletely-programmed cells, according to various embodiments of the invention.

For example, FIG. 7 is a flow diagram of a method 711 to manage drain select gate voltage that operates by counting the number of incompletely-programmed cells (e.g., how many cells have not yet been programmed to some selected level), according to various embodiments of the invention. Thus, the method 711 may begin at block 721. The method 711 may continue on to block 725 with determining whether a selected number of incompletely-programmed cells has been reached (e.g., only four cells out of 1024 cells remain to be programmed to Level 3 of available levels Level 0, Level 1, Level 2, and Level 3). If not, the method 711 may go on to block 729. If so, the method 711 may continue on to block 749.

For example, the first portion of the programming cycle may be terminated when the programmed cells are verified to have programming completed up to and including the level just below the maximum available programming level. Therefore, the selected level may be selected as one level below a maximum level of multiple (available) programming levels. The activity at block 725 may thus also include determining whether programming is complete for a selected number of cells (including all desired cells) within a selected level (e.g., Level 0 or Level 1 or Level 2) within the multi-level cells in an array.

The method 711 may continue on to block 729 with adjusting the drain select gate voltage value to a first, higher value. The method 711 may then continue on to block 733 with applying a first maximum value of the program selected data line voltage (e.g., $V_{BL1}$) to some of the plurality of memory cells in conjunction with applying the first, higher value of the drain select gate voltage.

The method 711 may then continue on to block 737, to verify the programming of the selected cells. This happens during each programming cycle. If the cells are verified as programmed, and programming of the cells is determined to be complete at bock 741, then the method 711 may end at block 745. However, if programming of the cells is not complete, as determined at block 741, the method 711 may continue on to block 757, to determine whether the desired maximum number of programming pulses is reached. If so, the method 711 may terminate at block 745. Otherwise, the additional programming pulse is counted at block 761, so that the pulse count is increased by one, and then the method 711 may continue on to block 725. Once the desired number of cells (and in some embodiments, levels of cells) associated with the first, higher drain select gate voltage is reached, as determined at block 725, the method 711 may continue on to block 749.

At block 749, the method 711 may thus comprise setting an adjusted select gate voltage value (e.g., a second, lower value) after verifying that the number of incompletely-programmed cells has reached a selected number of cells (including zero cells) that have not been programmed to a selected level of multiple programming levels. The adjusted value of the drain select gate voltage may be a reduced value from that applied previously during the same programming cycle.

The method 711 may go on to include block 753, with the activity of continuing the programming in conjunction with applying the adjusted select gate voltage value. The adjusted select gate voltage value, which is often a reduced value, is usually applied in conjunction with reducing the maximum value of the program selected data line voltage to some value (including a fixed value) that is less than the maximum value applied during the activity of block 721 (e.g., $V_{BL2} < V_{BL1}$, as shown and described in FIGS. 3-6). The method 711 may continue on to block 737, to verify the programming of the cells, and then on to blocks 741, 745, 757, and 761 as described previously.

The methods described herein do not have to be executed in the order described, or in any particular order. Moreover, various activities described with respect to the methods identified herein can be executed in repetitive, serial, or parallel fashion. The individual activities of the methods shown in FIGS. 5-7 can also be combined with each other and/or substituted, one for another, in various ways. For example, the activities of counting programming pulses and determining the number of incompletely-programmed cells may be combined to form a double-tiered approach to adjusting the level of the drain select gate voltage.

In addition, the methods shown in FIGS. 5-7 can be implemented in various devices, as well as in a computer-readable storage medium, where various portions of the methods are adapted to be executed by one or more processors. Information, including parameters, commands, operands, and other data, can be sent and received in the form of one or more carrier waves. Further details of such embodiments will now be described.

A software program may be launched from a computer-readable medium in a computer-based system to execute functions defined in the software program. Various programming languages may be employed to create software programs designed to implement and perform the methods disclosed herein. The programs may be structured in an object-oriented format using an object-oriented language such as Java or C++. Alternatively, the programs may be structured in a procedure-oriented format using a procedural language, such as assembly or C. The software components may communicate using a number of mechanisms well known to those of ordinary skill in the art, such as application program interfaces or inter-process communication techniques, including remote procedure calls. The teachings of various embodiments are not limited to any particular programming language or environment. Thus, other embodiments may be realized.

For example, an article of manufacture, such as a computer, a memory system, a magnetic or optical disk, some other storage device, and/or any type of electronic device or system may include a processor coupled to a machine-accessible medium such as a memory having associated information (e.g., computer program instructions and/or data 118 in FIG. 1), which, when accessed, results in a machine (e.g., the processor) performing any of the activities described herein with respect to the methods shown in FIGS. 5-7.

For the purposes of this document, the term "machine-readable medium" or "computer-readable medium" shall be taken to include any tangible non-transitory medium which is capable of storing or encoding a sequence of instructions for execution by a machine and that cause the machine to perform any one of the methodologies described herein.

The apparatus, systems, and methods disclosed herein may operate to increase the reliability of programming operations in a variety of memory devices, including flash memories. Improved processing speed and increased consumer satisfaction may result.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, comprising:
   an array of memory cells;
   an adjustment module to adjust, responsive to a number of programming pulses reaching a selected number, a drain select gate voltage value associated with the array of memory cells from a first value to a second value, that is less than the first value, between programming pulses applied to a subset of the array of memory cells during a single programming cycle, the drain select gate voltage to activate a select transistor to electrically couple a string of memory cells to a data line; and
   a data line voltage driver to provide a reduced value of a program selected data line voltage to a program selected group of the subset of the array of memory cells when the number of programming pulses reaches a selected number, synchronized with application of the second value of the drain select gate voltage.

2. The apparatus of claim 1, further comprising:
   a counter to count the number of the programming pulses applied to the subset of the array of memory cells, the counter to provide an indication to the adjustment module when the number of programming pulses reaches the selected number.

3. The apparatus of claim 1, further comprising:
   a counter to count a number of incompletely-programmed memory cells within the subset of the array of memory cells, the counter to provide an indication to the adjustment module when the number of incompletely-programmed memory cells reaches the selected number.

4. An apparatus, comprising:
   an array of memory cells;
   a determination module to determine a number of programming pulses applied to a subset of the array of memory cells during a single programming cycle;
   an adjustment module to adjust a drain select gate voltage value associated with the array of memory cells responsive to the number of programming pulses; and
   a data line voltage driver to provide a reduced value of a program selected data line voltage to a program selected group of the subset of the array of memory cells when the number of programming pulses reaches a selected number, synchronized with application of a reduced value of the drain select gate voltage.

5. An apparatus, comprising:
   an array of memory cells;
   a determination module to determine a number of memory cells within the array of memory cells that have not been programmed to a selected level; and
   an adjustment module to reduce a drain select gate voltage value associated with the array of memory cells responsive to the number of memory cells, wherein the drain select gate voltage is reduced between programming pulses of a programming cycle associated with the array, the drain select gate voltage to activate a select transistor to electrically couple a string of memory cells in the array to a data line; and
   a data line voltage driver to provide a reduced value of a program selected data line voltage to a program selected group of a subset of the array of memory cells when the number of memory cells reaches a selected number, synchronized with application of the reduced drain select gate voltage value.

6. The apparatus of claim 5, wherein the determination module is to determine a number of memory cells within the array of memory cells that have not been programmed to a selected level that is one level less than a maximum level.

7. The apparatus of claim 5, further comprising:
   the data line voltage driver to provide a positive program selected data line voltage to a program selected group of the memory cells within the array of memory cells until the drain select gate voltage value is adjusted.

8. A method, comprising:
   applying a first value of a drain select gate voltage during a first portion of a programming time period associated with programming a plurality of memory cells; and
   applying a second value of the drain select gate voltage different from the first value during a second, subsequent portion of the programming time period associated with programming the plurality of memory cells, wherein the programming time period forms a part of a single programming cycle during which programming pulses are applied to a program selected group of the plurality of memory cells wherein the second value of the drain select gate voltage is less than the first value of the drain select gate voltage;
   applying a first value of a program selected data line voltage to the program selected group of the plurality of memory cells prior to a selected number of programming pulses being reached; and
   applying a second value of the program selected data line voltage to the program selected group of the plurality of memory cells when the selected number of programming pulses is reached, synchronized with application of the second value of the drain select gate voltage.

9. The method of claim 8, further comprising:
   refraining from applying the second value of the drain select gate voltage until a number of the programming pulses applied to the plurality of memory cells reaches a selected number less than a maximum number.

10. The method of claim 8, wherein some of the plurality of memory cells comprise cells having multiple levels, further comprising:
    refraining from applying the second value of the drain select gate voltage until a selected number of the plurality of memory cells has been programmed to a selected level of the multiple levels.

11. The method of claim 10, wherein the selected level comprises one of a first level or a second level, the first level and the second level being less than a maximum level of the multiple levels.

12. The method of claim 10, wherein the selected level comprises one level below a maximum level of the multiple levels.

13. A method, comprising:
    applying a first value of a drain select gate voltage during a first portion of a programming time period associated with programming a plurality of memory cells;
    applying a second value of the drain select gate voltage different from the first value during a second, subsequent portion of the programming time period associated with programming the plurality of memory cells, wherein the programming time period forms a part of a single programming cycle during which programming pulses are applied to at least some of the plurality of memory cells; and applying a program selected data line voltage to a program selected group of the plurality of memory cells during the second portion of the programming time period that is less than a program selected data line voltage applied to the program selected group of the plurality of memory cells during the first portion of the programming time period.

14. A method, comprising:

applying a first value of a drain select gate voltage during a first portion of a programming time period associated with programming a plurality of memory cells;

applying a second value of the drain select gate voltage different from the first value during a second, subsequent portion of the programming time period associated with programming the plurality of memory cells, wherein the programming time period forms a part of a single programming cycle during which programming pulses are applied to at least some of the plurality of memory cells; and applying a non-positive program selected data line voltage to a program selected subset of the plurality of memory cells during the second, subsequent portion of the programming time period only when a highest level of programming voltage is applied to the subset.

15. A method, comprising:

counting a number of programming pulses applied to a plurality of memory cells during a single programming cycle while a drain select gate voltage value associated with the plurality of memory cells is applied to activate a select transistor to electrically couple a string of the memory cells to a data line;

reducing the drain select gate voltage value to a lower select gate voltage value after the number of programming pulses has reached a selected number less than a maximum number; and reducing a program selected data line voltage to the plurality of memory cells when the number of programming pulses reaches the selected number, synchronized with application of the lower select gate voltage value; and continuing to apply the programming pulses to the plurality of memory cells in conjunction with applying the adjusted select gate voltage value until the number of programming pulses reaches the maximum number during the single programming cycle.

16. A method, comprising:

counting a number of programming pulses applied to a plurality of memory cells during a single programming cycle while a drain select gate voltage value associated with the plurality of memory cells is applied;

adjusting the drain select gate voltage value to an adjusted select gate voltage value after the number of programming pulses has reached a selected number less than a maximum number;

continuing to apply the programming pulses to the plurality of memory cells in conjunction with applying the adjusted select gate voltage value until the number of programming pulses reaches the maximum number during the single programming cycle;

applying a first maximum program selected data line voltage to a program selected group of the plurality of memory cells in conjunction with applying the drain select gate voltage value; and applying a second maximum program selected data line voltage to the program selected group of the plurality of memory cells in conjunction with applying the adjusted select gate voltage value, the second maximum program selected data line voltage less than the first maximum program selected data line voltage.

17. A method, comprising:

counting a number of incompletely-programmed memory cells in a plurality of memory cells while a drain select gate voltage value associated with the plurality of memory cells is applied to activate a select transistor to electrically couple a string of the plurality of memory cells to a data line during programming the plurality of memory cells as part of a single programming cycle;

reducing the drain select gate voltage value to a lower select gate voltage value after verifying that the number of incompletely-programmed memory cells has reached a selected number of memory cells that have not been programmed to a selected level of multiple programming levels;

continuing the programming in conjunction with applying the reduced select gate voltage value as part of the single programming cycle;

applying a first program selected data line voltage to the plurality of memory cells in conjunction with applying the drain select gate voltage value; and applying a second program selected data line voltage to the plurality of memory cells in conjunction with applying the lower drain select gate voltage value, the second program selected data line voltage less than the first program selected data line voltage.

18. The method of claim 17, wherein the programming is continued until a number of programming pulses applied to the plurality of memory cells reaches a maximum number.

* * * * *

UNITED STATES PATENT AND TRADEMARK OFFICE
CERTIFICATE OF CORRECTION

PATENT NO. : 8,767,487 B2
APPLICATION NO. : 12/715530
DATED : July 1, 2014
INVENTOR(S) : Akira Goda et al.

Page 1 of 1

It is certified that error appears in the above-identified patent and that said Letters Patent is hereby corrected as shown below:

In the Claims

Column 13, line 63, Claim 5, after "level;" delete "and".

Column 14, line 23, Claim 8, after "cells;" delete "and".

Column 15, line 42, Claim 15, after "number;" delete "and".

Signed and Sealed this
Fourth Day of November, 2014

Michelle K. Lee
*Deputy Director of the United States Patent and Trademark Office*